(12) United States Patent
Fujii et al.

(10) Patent No.: US 6,480,071 B1
(45) Date of Patent: Nov. 12, 2002

(54) PIEZOELECTRIC OSCILLATOR AND ELECTRONIC DEVICE

(75) Inventors: Yoichi Fujii, Minowa-machi (JP); Takashi Endo, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 42 days.

(21) Appl. No.: 09/699,421

(22) Filed: Oct. 31, 2000

(30) Foreign Application Priority Data

Nov. 18, 1999 (JP) .......................... 11-328792

(51) Int. Cl.$^7$ .............. H03B 5/36; H03B 5/32
(52) U.S. Cl. .............. 331/74; 331/116 FE; 331/116 R; 331/158; 331/36 C; 331/177 V
(58) Field of Search .......................... 331/116 FE, 158, 331/74, 116 R, 36 C, 177 V

(56) References Cited

U.S. PATENT DOCUMENTS

| 5,126,695 A | 6/1992 | Abe | 331/46 |
| 5,568,100 A | 10/1996 | Locanthi | 331/74 |

FOREIGN PATENT DOCUMENTS

| EP | 1102 391 A2 * | 5/2001 |
| JP | 57-103408 | 6/1982 |
| JP | 58060806 | 4/1983 |
| JP | 59169301 | 9/1984 |
| JP | 4-81009 | 3/1992 |
| JP | 5-48440 | 2/1993 |

* cited by examiner

*Primary Examiner*—Arnold Kinkead
(74) *Attorney, Agent, or Firm*—Oliff & Berridge, PLC

(57) ABSTRACT

A piezoelectric oscillator and an electronic device are provided that can stabilize start characteristics by reducing power noise during a power supply process and which can improve oscillation stability. Included are an oscillation stage so as to generate oscillation pulses by exciting a piezoelectric resonator, an output stage to amplify and then output oscillation pulses, and a start delaying circuit so as to start the output stage later than the oscillation stage only by a selected delay time from a plurality of delay times.

19 Claims, 13 Drawing Sheets

10: piezoelectric oscillator

| CNT | G | D |
|-----|---|----|
| L | L | HZ |
| L | H | HZ |
| H | L | H |
| H | H | L |

HZ: high impedance

60: piezoelectric oscillator

1: piezoelectric oscillator

PIEZOELECTRIC OSCILLATOR AND ELECTRONIC DEVICE

BACKGROUND OF THE INVENTION

1. Field of Invention

The present invention relates to a piezoelectric oscillator and an electronic device.

2. Description of Related Art

FIG. 12 is a block view of a piezoelectric oscillator used for an electronic device. As shown in FIG. 12, a piezoelectric oscillator 1 is made up of an oscillation stage 2 and an output stage 3. As shown in FIG. 12, the piezoelectric oscillator is connected to a power supply 4 via a switch 5.

As shown in FIG. 13, in the piezoelectric oscillator 1, the oscillation stage 2 is a colpitts oscillation circuit consisting of a piezoelectric resonator X, an inverter INV1 for oscillation, a feedback resistor Rf, a capacitor Cg on the gate side, and a capacitor Cd on the drain side, and the output stage 3 is an inverter INV2 for output.

Specifically, the piezoelectric oscillator 1 outputs oscillation pulses P generated at the oscillation stage 2 through the output stage 3 to an external load to be connected to the piezoelectric oscillator 1. Thus, oscillation stability is maintained by avoiding the frequency deviations of the oscillation pulses P caused by the external load. At the same time, oscillation pulses P can be amplified at the output stage 3 up to the level of driving the external load.

Moreover, in order to minimize the spurious modes of the oscillation pulses P, it is generally preferable to excite the piezoelectric resonator X by low driving power in a range in which oscillation can continue.

Subsequently, at the oscillation stage 2 of the piezoelectric oscillator 1, the inverter INV1 of the oscillation stage 2 restrains driving power.

On the other hand, at the output stage 3 of the piezoelectric oscillator 1, there is a need to amplify the oscillation pulses P up to the level of driving the external load, so that the inverter INV2 of the output stage 3 has more driving power than the inverter INV1 of the oscillation stage 2.

FIG. 14 is an example of a circuit FIGURE of the inverter INV1 at the oscillation stage 2 and the inverter INV2 at the output stage 3. As shown in FIG. 14, these inverters connect a PMOS transistor and an NMOS transistor in series, and are configured by connecting one end of the PMOS transistor and one end of the NMOS transistor to a power source VDD and a ground GND, respectively, wherein the common gate of the PMOS transistor and the NMOS transistor is input G and the node is output D.

When power is input to the piezoelectric oscillator 1, through-current which is proportional to the driving power of each inverter instantaneously flows to the inverter INV1 at the oscillation stage 2 and the inverter INV2 at the output stage 3.

SUMMARY OF THE INVENTION

As mentioned above, the inverter INV2 at the output stage 3 has more driving power, so that the through-current that flows to the inverter INV2 at the output stage 3, is large, generating noise during the power supply process.

Subsequently, power noise by the inverter INV2 at the output stage 3 prevents the inverter INV1 at the oscillation stage 2, which has lower driving power so as to reduce spurious modes of oscillation pulses P, from stably starting, thereby resulting in the abnormal oscillation and non-oscillation of the oscillation stage 2.

Thus, it is an object of the present invention to at least provide a piezoelectric oscillator which can lower noise during the power supply process so as to stabilize the starting properties and to improve oscillation stability, and an electric device having this piezoelectric oscillator.

A piezoelectric oscillator according to an exemplary embodiment of this invention has an oscillation stage to generate oscillation pulses by exciting a piezoelectric resonator, an output stage to amplify and then output the oscillation pulses, and a start delaying circuit having a plurality of delay times so as to start the output stage from the oscillation stage later than the oscillation stage by a delay time selected from a plurality of delay times.

In the piezoelectric oscillator according to another exemplary embodiment of this invention, the start delaying circuit has a selection circuit so as to select a predetermined delay time from the plurality of delay times based on pre-set information, a delaying circuit to gradually raise start signals in response to the selected delay time and then output the signals, and a starting circuit to start the output stage in response to the value of the start signals.

In the piezoelectric oscillator according another exemplary embodiment of this invention, the start delaying circuit has a selection circuit so as to select a corresponding delay time from a plurality of delay times based on pre-set information, and a delaying circuit to gradually raise start signals in response to the selected delay time and then output the signals. The output stage starts in response to the value of the start signals.

In the piezoelectric oscillator according to another exemplary embodiment of this invention, the delaying circuit has a resistance element, a plurality of capacitance elements, and a plurality of switching devices connected to the plurality of capacitance elements, respectively. The selection circuit sets the time constants of the delaying circuit to the selected corresponding delay time by controlling the plurality of switching devices based on the set information.

In the piezoelectric oscillator according to another exemplary embodiment of this invention, the delaying circuit has a capacitance element, a plurality of resistance elements, and a plurality of switching devices connected to the plurality of resistance elements, respectively. The selection circuit sets the time constants of the delaying circuit to the selected corresponding delay time by controlling the plurality of switching devices based on the set information.

In the piezoelectric oscillator according to another exemplary embodiment of this invention, the switching devices are transistors and the resistance elements are the ON resistance of the transistors.

In the piezoelectric oscillator according another exemplary embodiment of this invention, the start delaying circuit has a selection circuit so as to select a predetermined delay time from the plurality of delay times based on pre-set information, a delaying circuit to output start signals after the passage of the selected delay time as the oscillation stage is started, and a starting circuit to start the output stage in response to the value of the start signals.

In the piezoelectric oscillator according to another exemplary embodiment of this invention, the start delaying circuit has a selection circuit so as to select a predetermined delay time among the plurality of delay times based on pre-set information, and a delaying circuit to output start signals after the passage of the selected delay time as the oscillation stage is started. The output stage starts in response to the value of the start signals.

In the piezoelectric oscillator according to another exemplary embodiment of this invention, the delaying circuit has an oscillation circuit to generate oscillation pulses for setting the delay time, and a counter to count the oscillation pulses for setting the delay time and switch signal levels of the start signals as a counted number reaches a pre-set value. The selection circuit sets the value of the counter to a value corresponding to the selected delay time based on the set information.

In the piezoelectric oscillator according to another exemplary embodiment of this invention, the oscillation circuit is the oscillation stage.

In the piezoelectric oscillator according to another exemplary embodiment of this invention, the output stage is configured by connecting a plurality of clocked gates in rows. The starting circuit starts the output stage by operating predetermined clocked gates among the plurality of clocked gates based on set information, which was pre-set, in response to the value of the start signals.

In the piezoelectric oscillator according to another exemplary embodiment of this invention, the selection circuit has an input terminal for inputting set information. The set information, which was pre-set, is renewed to new set information as the new set information is input through the input terminal for inputting the set information.

In the piezoelectric oscillator according to another exemplary embodiment of this invention, the starting circuit has an input terminal for stopping output. The output stage stops operating as the output stop signals are input through the input terminal for stopping the output after the output stage is started.

In the piezoelectric oscillator according to another exemplary embodiment of this invention, except for the piezoelectric resonator, a circuit is integrated.

The piezoelectric oscillator according to another exemplary embodiment of this invention is stored in one package.

In another exemplary embodiment of this invention, an electric device has the piezoelectric oscillator according to the exemplary embodiments discussed above, and operates based on the oscillation pulses output from the piezoelectric oscillator.

DETAILED DESCRIPTION OF PREFERRED EMBODIMENTS

Exemplary embodiments of the present invention are described hereafter, with reference to the drawings.

(1) Exemplary Embodiment
(1-1) Configuration of Exemplary Embodiment

Figure 1:
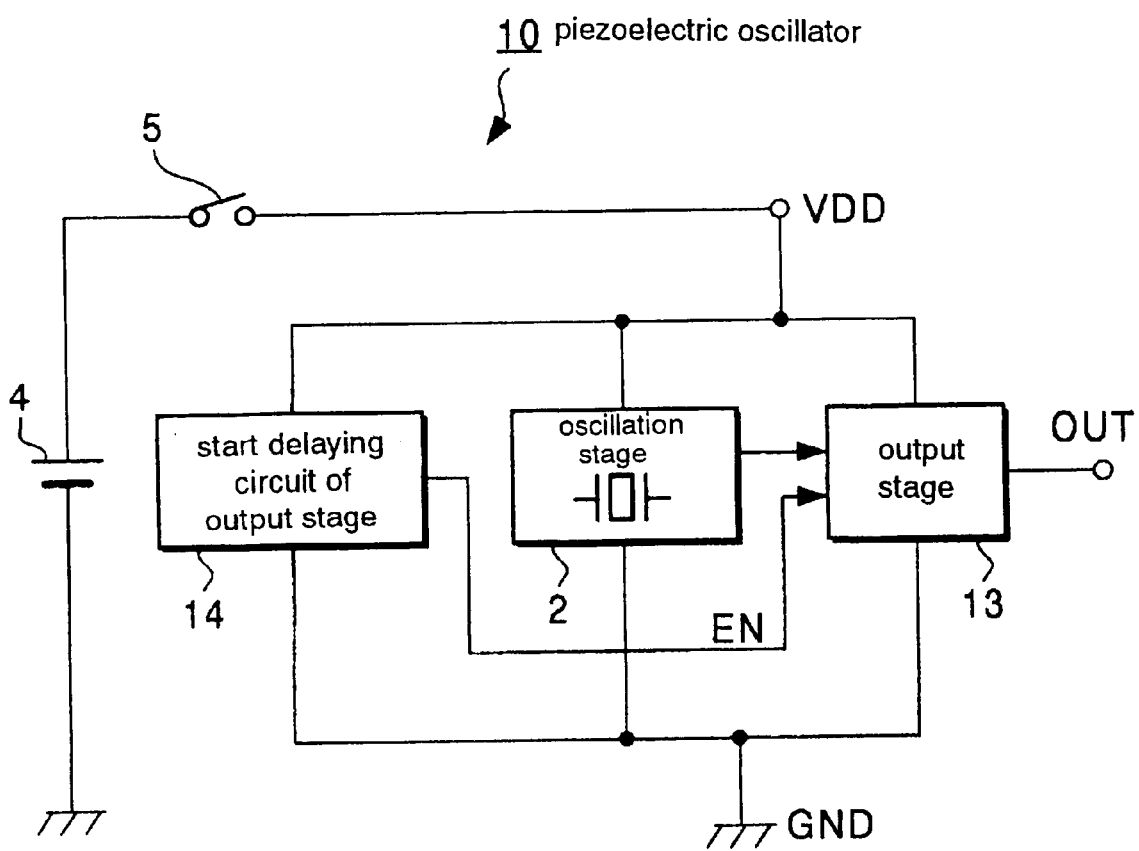
FIG. 1 is a block view of a piezoelectric oscillator relating to one exemplary embodiment of the present invention.

FIG. 1 is a block view of a piezoelectric oscillator relating to an exemplary embodiment of the present invention.

Figure 12:
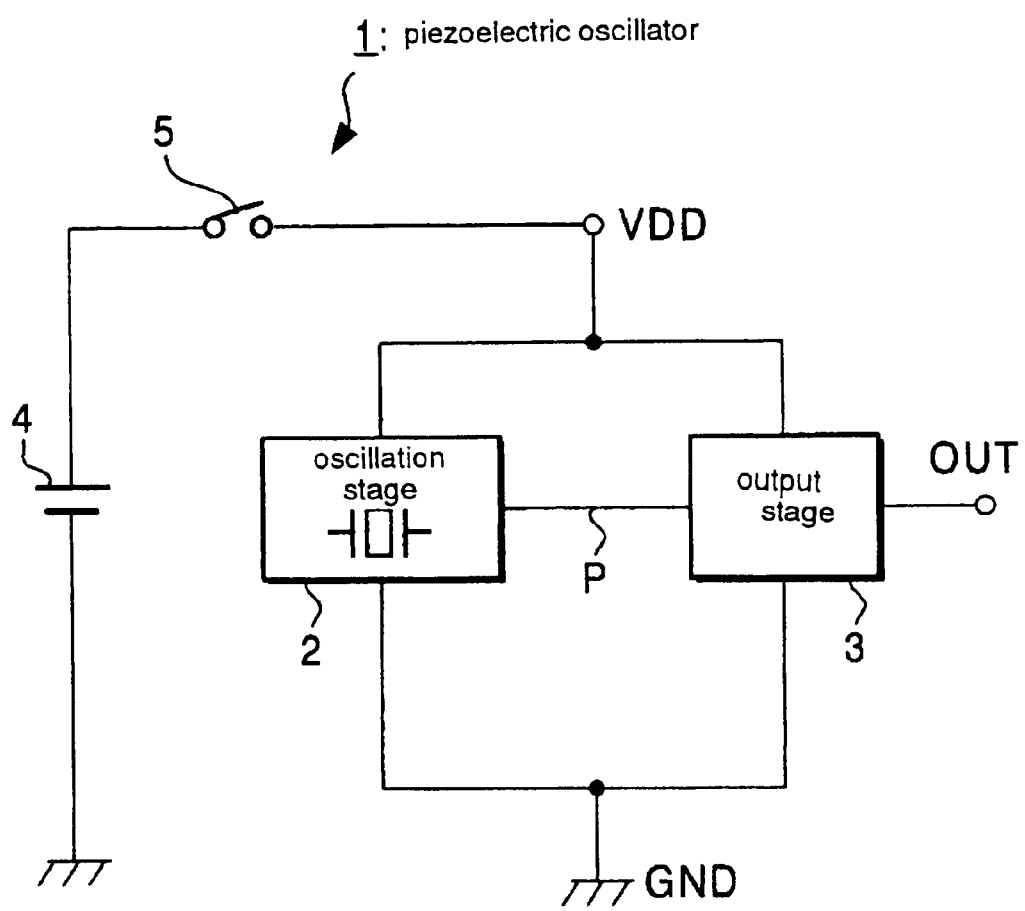
FIG. 12 is a block view of a piezoelectric oscillator in use for an electronic device.
Figure 13:
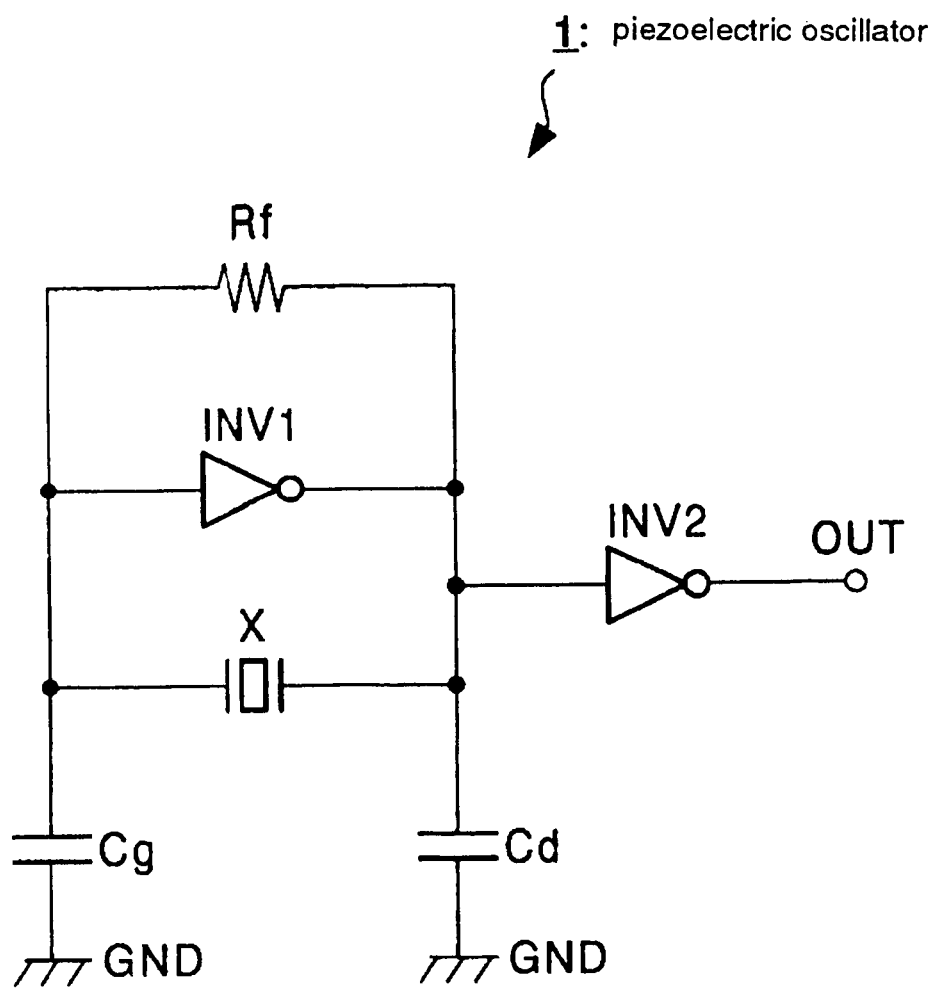
FIG. 13 is a circuit view of the piezoelectric oscillator in FIG. 12.
Figure 14:
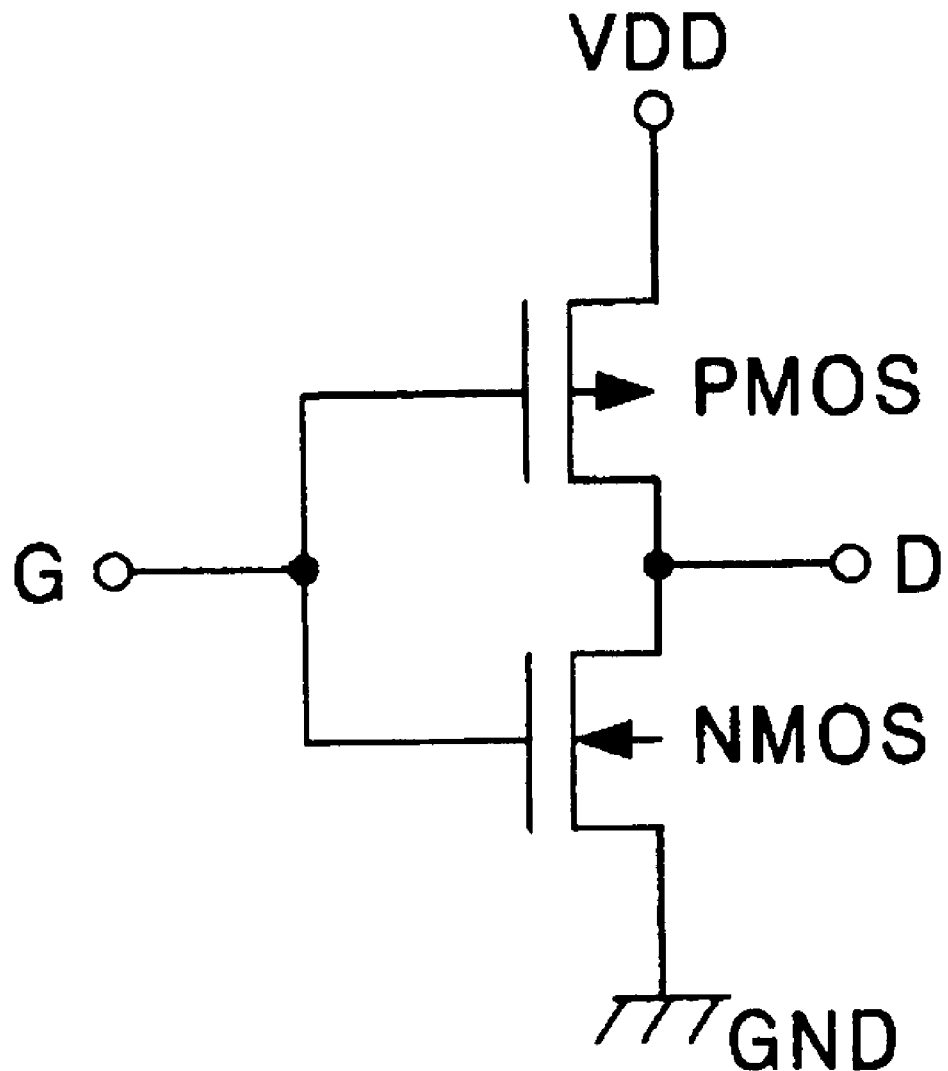
FIG. 14 is a circuit view of inverters of an oscillation stage and an output stage of the piezoelectric oscillator in FIG. 12.

As shown in FIG. 1, the piezoelectric oscillator 10 is the same as the piezoelectric oscillator 1 of FIG. 12, except that the configuration of the output stage 13 is different from the output stage 3 of FIG. 12, and the start delaying circuit of the output stage 14 is arranged so as to delay the output stage 13 from starting. Hence, the same reference numerals are used for identical parts and the explanation thereof is omitted.

(1-1-1) Output Stage

Figure 2:
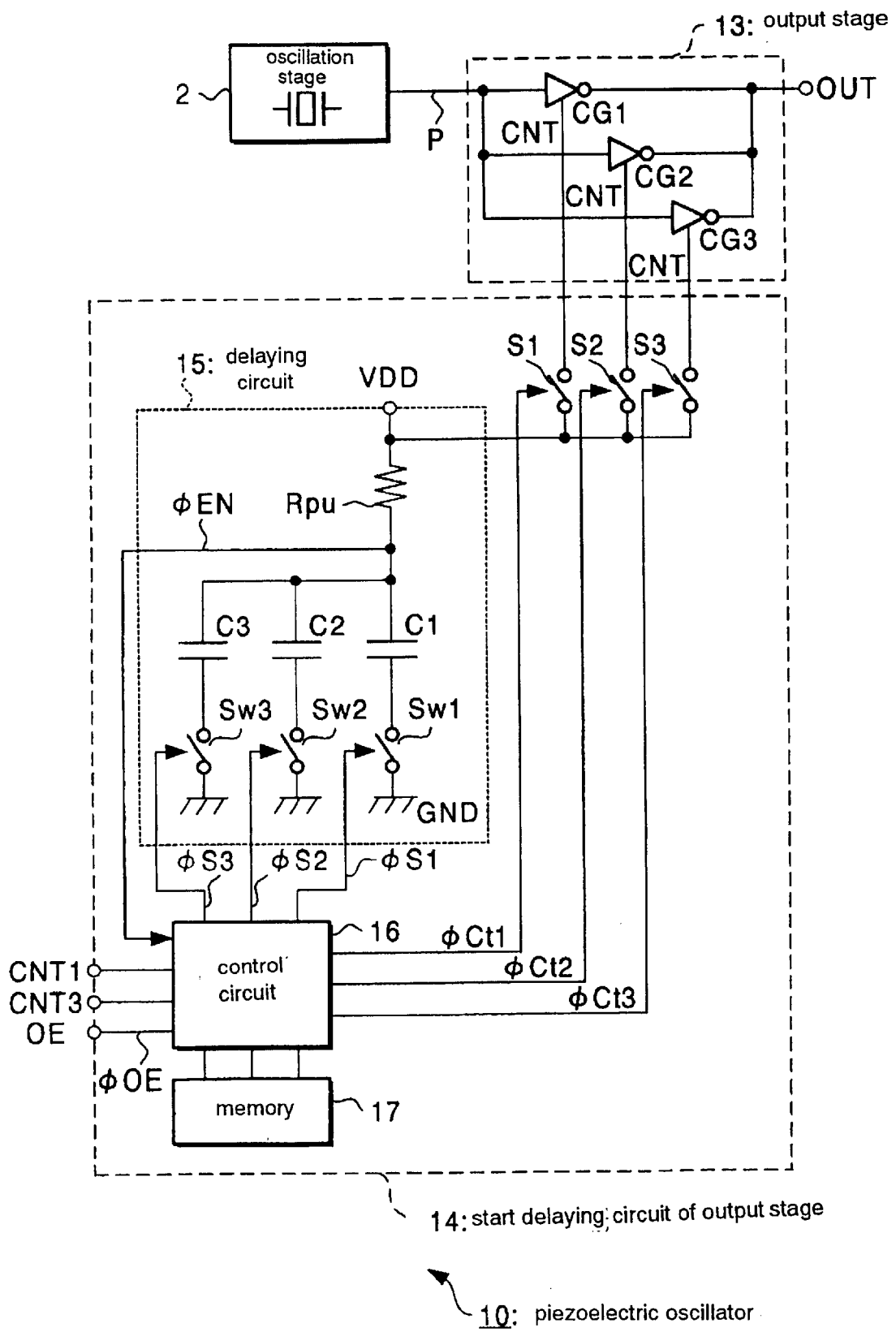
FIG. 2 is a block view, showing a circuit configuration of an output stage and a start delaying circuit of the output stage of the piezoelectric oscillator.
Figures 3, 4:
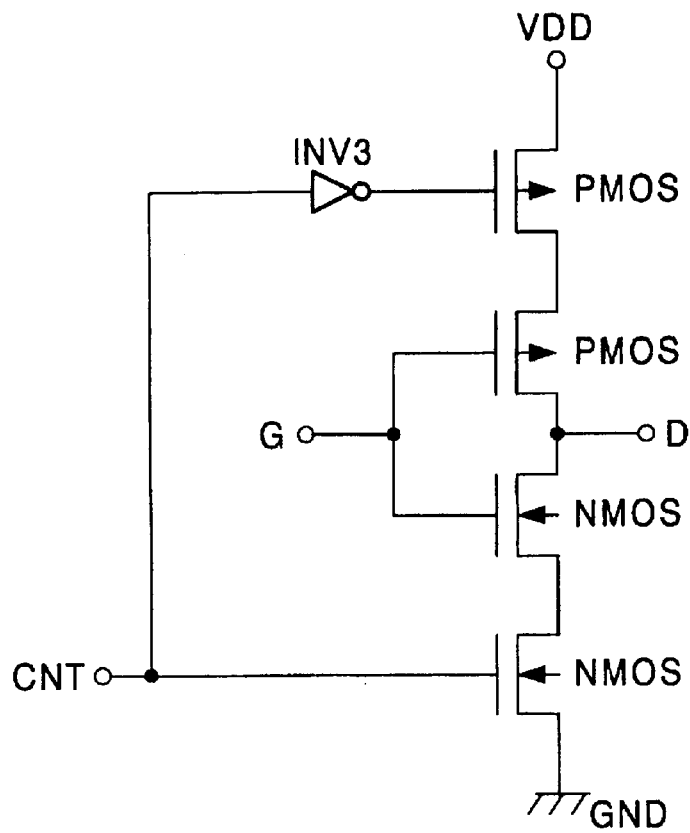
FIG. 3 is a circuit view of a clocked gate.
FIG. 4 is a truth table of the clocked gate.

FIG. 2 is a block view, showing the circuit configurations of the output stage 13 and the start delaying circuit of the output stage 14, in the piezoelectric oscillator 10. As shown in FIG. 2, the output stage 13 is configured by connecting three clocked gates CG1, CG2 and CG3 in rows. As shown in a clocked gate circuit diagram of FIG. 3, the clocked gate is configured by connecting two PMOS transistors and two NMOS transistors in series. As shown in FIG. 3, the common gate of one of the PMOS transistors and one of the NMOS transistors is input G and the node thereof is output D. As shown in FIG. 3, the gate INV3 arranged at the gate of the PMOS transistor on the side of a power source VDD is the input side, and the node at the gate of the NMOS transistor on the side of ground GND is the input CNT.

As shown in the truth table of the clocked gate of FIG. 4, when input CNT is at a high level (H), the clocked gate operates to reverse the signal level of the input G and the signal level of the output D. When the input CNT is at the low level (L), the output D will be in a so-called high impedance state regardless of the input G.

In other words, the clocked gate switches between the operational state where it operates as a normal inverter in response to the signal level of the input CNT and the non-operational state where output practically becomes open.

Subsequently, as shown in FIG. 2, the output stage 13 outputs by adding oscillation pulses P, which are output only from the clocked gates at a high level of input CNT among the clocked gates CG1 to CG3.

As a result, an amplification factor of oscillation pulses P of the output stage 13, in other words, driving power of an inverter IN wherein the output stage 13 is considered to be one inverter IN, changes in response to the number of clocked gates at a high level of input CNT.

A clocked gate is made up of MOS transistors for description herein, but may be made up of bipolar transistors.

(1-1-2) Start Delaying Circuit of Output Stage

As shown in FIG. 2, the start delaying circuit of the output stage 14 consists of a delaying circuit 15 for outputting start signals ØEN, three switches S1, S2 and S3 having one end connected to each input CNT of the clocked gates CG1 to CG3 of the output stage 13 and another end commonly connected to the power source VDD, and a control circuit (selection circuit and starting circuit) 16 for controlling the delaying circuit 15 and the switches S1 to S3.

The delaying circuit 15 consists of a pull-up resistor Rpu having one end connected to the power source VDD, three capacitors C1, C2 and C3 connected in rows to the other end of the pull-up resistor Rpu, and three switches Sw1, Sw2 and Sw3 having one end connected to each capacitor C1 to C3 and the other end connected to ground GND.

Additionally, a node between the pull-up resistor Rpu and the capacitors C1 to C3 is connected to the control circuit 16, and start signals ØEN generated by the delaying circuit 15 are input to the control circuit 16.

Subsequently, the delaying circuit 15 gradually raises start signals ØEN by time constants, which are determined by the capacitances of capacitors C1 to C3 connected to the ON state switches among the switches Sw1 to Sw3 and the resistance of the pull-up resistor Rpu, as power is supplied.

As a result, the delaying circuit 15 can delay the timing to obtain high-level start signals ØEN from the timing to start the power supply.

In this case, the delay time, which is between the time for supplying power and the time for obtaining high-level start signals ØEN, is switched in response to the connection of the switches Sw1 to Sw3.

Therefore, when the capacitances of the capacitors C1 to C3 are the same, three types of time constants, in other words, three types of delay time can be set in response to the number of ON switches among the switches Sw1 to Sw3.

Moreover, when the capacitances of the capacitors C1 to C3 are made different from each other, delay time can be changed by selecting the switches to be turned ON, from the switches Sw1 to Sw3. Furthermore, by selecting the combination of switches to be turned ON among the switches Sw1 to Sw3, delay time can be variously set.

As one end of the switches S1 to S3 is connected to the power source VDD as described above, power is supplied to the input CNT of the predetermnined clocked gates CG1 to CG3 through the ON switches.

Subsequently, when predetermined switches among switches S1 to S3 are turned ON after power is supplied, the output stage 13 starts amplifying and then outputting oscillation pulses P with the driving power in response to the number of ON state switches.

By controlling the switches Sw1 to Sw3 and switches S1 to S3 of the delaying circuit 15, the control circuit 16 operates to control the delaying circuit 15 and the output stage 13.

In other words, the control circuit 16 controls the connecting state of each switch Sw1 to Sw3 by outputting control signals ØS1, ØS2 and ØS3 to the switches Sw1 to Sw3, respectively, based on the set data, which was prestored in memory 17, when power is supplied from the power source VDD. Subsequently, the control circuit 16 can set the delay time, which is between the time for supplying the start signals ØEN by the delaying circuit 15 and the time for raising the signals to a high level, at a predetermined time.

Accordingly, when start signals ØEN supplied by the delaying circuit 15 are raised to a high level, the control circuit 16 outputs control signals ØCt1, ØCt2 and ØCt3 to the switches S1 to S3, respectively, based on the set data which was prestored in the memory 17, thus turning ON a predetermined number of switches. As a result, the control circuit 16 sets the driving power of the output stage 13, and at the same time, starts the output stage 13.

Subsequently, as power is supplied, the control circuit 16 sets the delay time, which is between the time for the power supply and the time for raising start signals ØEN to a high level based on predetermined set data, and starts the output stage 13 with predetermined driving power when the delay time is over.

In other words, in the piezoelectric oscillator 10, the output stage 13 is started, delayed only by a predetermined delay time, by the control circuit 16, relative to the oscillation stage 2, which starts right after power is supplied.

Additionally, the control circuit 16 has input terminals for inputting set data (input terminals for inputting set information) CNT1, CNT2 and CNT3 as the input terminals, and an input terminal for inputting output stop signals (input terminal for stopping output) OE.

Specifically, as set data is input through the input terminals CNT1 to CNT3 for inputting set data, the set data kept in the memory 17 is renewed to the set data additionally supplied.

As a result, this piezoelectric oscillator 10 can change the delay time, which is between the time for power supplied and the time for starting the output stage 13, as well as the driving power of the output stage 13. Although it has been explained that the set data is input as parallel data by arranging three input terminals CNT1 to CNT3 for setting in response to the switches Sw1 to Sw3 and the switches S1 to S3, there may be just one input terminal for inputting set data and the set data may be input as serial data.

Also, the control circuit 16 stops the operation of the output stage 13 by decisively controlling the switches S1 to S3 of the output stage 13 so as to stop the operation of the output stage 13 when output stop signals ØOE are input from the outside through the input terminal OE for inputting the output stop signals after the start of the output stage 13.

Therefore, the piezoelectric oscillator 10 can stop the output of oscillation pulses from the piezoelectric oscillator 10 at the timing preferred by the user of the piezoelectric oscillator 10.

(1-2) Setting of Delay Time

Figure 5:
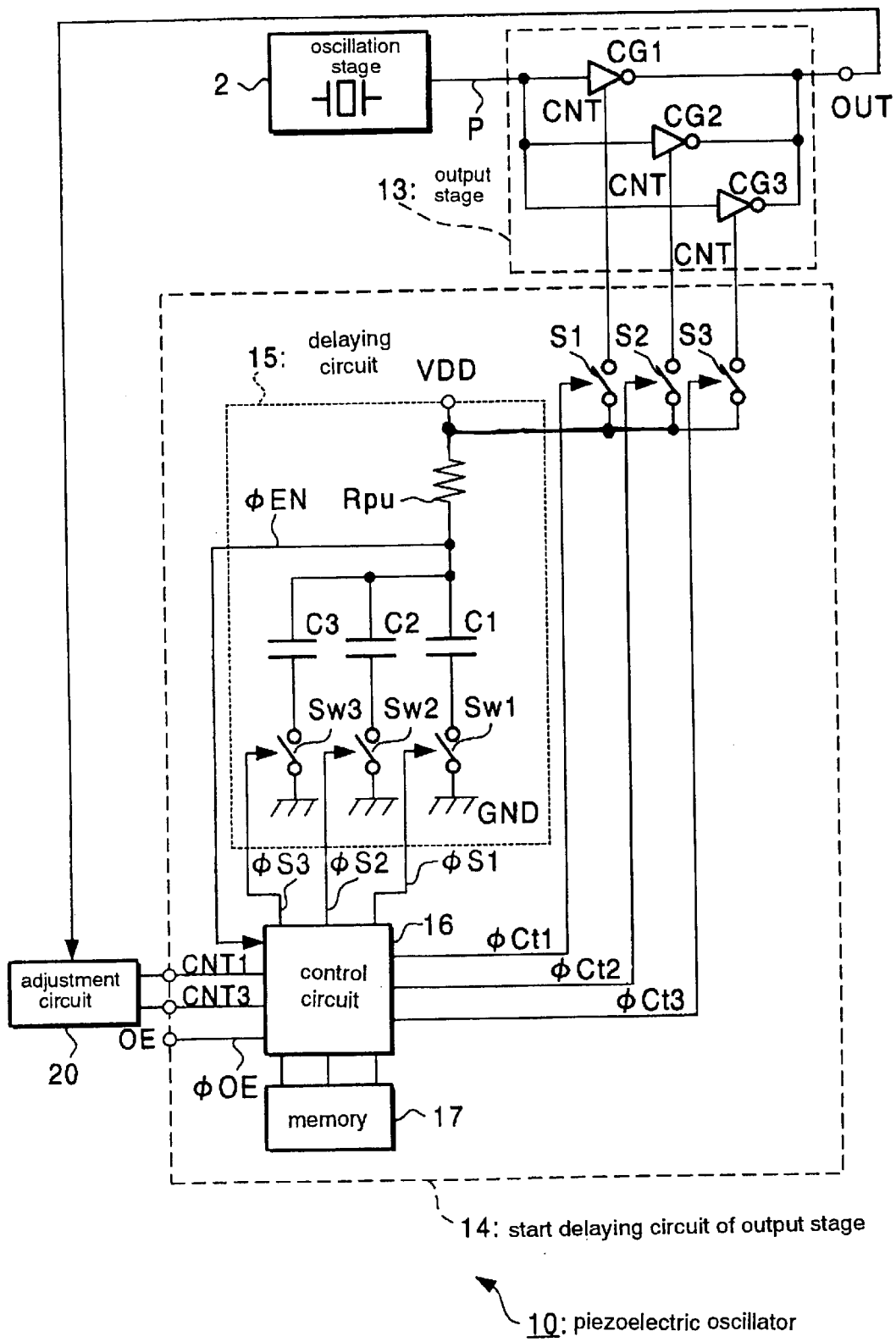
FIG. 5 is a block figure of the piezoelectric oscillator for setting delay time.

Accordingly, the piezoelectric oscillator 10 is set at an appropriate delay time of the output stage 13, which is explained with reference to FIG. 5.

First, data is set at an adjustment circuit 20 so as to set the connecting conditions of the switches S1 to S3 and the switches Sw1 to Sw3 by operating the external adjustment circuit 20.

The switches S1 to S3 are principally set based on the driving power necessary for the output stage 13.

In this regard, the setting of the switches Sw1 to Sw3, in other words, the delay time to delay the output stage 13 from starting should be set so that the output stage 13 starts after the power noise generated at the output stage 13 no longer affects the starting of the oscillation stage 2. Therefore, the time must be established corresponding to the starting properties of the inverter INV1 of the oscillation stage 2, and the driving power of the output stage 13 and the like.

Thus, so as to set the switches to be turned ON among switches Sw1 to Sw3, it is appropriately confirmed whether there is any abnormal oscillation or non-oscillation while output signals of the piezoelectric oscillator 10 are being monitored.

Then, as soon as the power of the piezoelectric oscillator 10 is turned on, the set data, maintained by the adjustment circuit 20, is supplied to the control circuit 16 of the piezoelectric oscillator 10 through the terminals CNT1 to CNT3 for setting, thus renewing the set data maintained at the memory 17, to new set data through the control circuit 16.

Thus, by supplying new set data to the control circuit 16 as soon as the power of the piezoelectric oscillator 10 is turned on, the set data maintained at the memory 17 before the oscillation stage 2 starts oscillating, can be renewed to new set data. The starting property of the piezoelectric oscillator 10, based on new set data, can then be monitored immediately.

In this case, moreover, set data can be recorded in memory 17 before the oscillation stage 2 starts oscillating, even if the set data is not yet recorded in the memory 17, thus avoiding the malfunction of the piezoelectric oscillator 10, caused by not recording set data.

Then, based on the monitored results by the adjustment circuit 20, oscillation frequencies of output signals at the beginning of oscillation are measured. When there is abnormal oscillation or non-oscillation, the set data to change the setting of the switches Sw1 to Sw3 is reset at the adjustment circuit 20 and the above-noted operation is repeated.

As a result, there is no longer abnormal oscillation or non-oscillation and the like of output signals at the piezoelectric oscillator 10. At the same time, it is confirmed that the piezoelectric oscillator 10 has gained a stable starting properties, and the setting of delay time is finished.

Thus, predetermined delay time can be easily selected out of the candidate plurality of delay times, and an appropriate delay time can be set.

Additionally, the memory 17 of the control circuit 16 may be a non-volatile writable type, which can be written only once. In this case, in setting delay time, the control circuit 16 controls each switch Sw1 to Sw3 based on the set data kept at the adjustment circuit 20, instead of the set data kept at the memory 17. After an appropriate delay time is provided, corresponding set data is recorded in the memory 17, thus setting the appropriate delay time.

(1-3) Efficacy of the Exemplary Embodiment

The piezoelectric oscillator 10 relating to the present embodiment starts the output stage 13 later than the oscillation stage 2 by a predetermined delay time, so that the starting property of the oscillation stage 2 can be stabilized by avoiding the power noise generated at the output stage 13 during the power supply process, and the oscillation stability of oscillation pulse can be improved.

Moreover, the output stage 13 is configured by connecting a plurality of clocked gates in rows, so that the driving power of the output stage 13 can be changed to various driving powers preferred by the user. Thus, there is no need to prepare a piezoelectric oscillator for each user as with conventional piezoelectric oscillators, and the piezoelectric oscillator 10 can respond to various user needs.

(2) Exemplary Modified Embodiments (2-1) First Exemplary Modified Embodiment

In the description of the above-mentioned exemplary embodiment, three pairs of capacitors and switches are arranged so as to change the time constants of the delaying circuit 15. However, the present invention is not limited to this case. The number of capacitor and switch combinations may be increased or decreased in response to the necessary number of candidate delay times. Moreover, the number of clocked gates, constituting the output stage 13, may be increased or decreased. In this case, the number of switches, controlling the clocked gates, may be increased or decreased.

(2—2) Second Exemplary Modified Embodiment

In the above-noted exemplary embodiment, the delaying circuit 15 consists of one pull-up resistor, a plurality of capacitors, and switches so as to control the connection/non-connection of each capacitor. However, the present invention is not limited to this case, and can broadly apply circuits, whose time constants change in response to the connection state of each switch.

Figure 6:
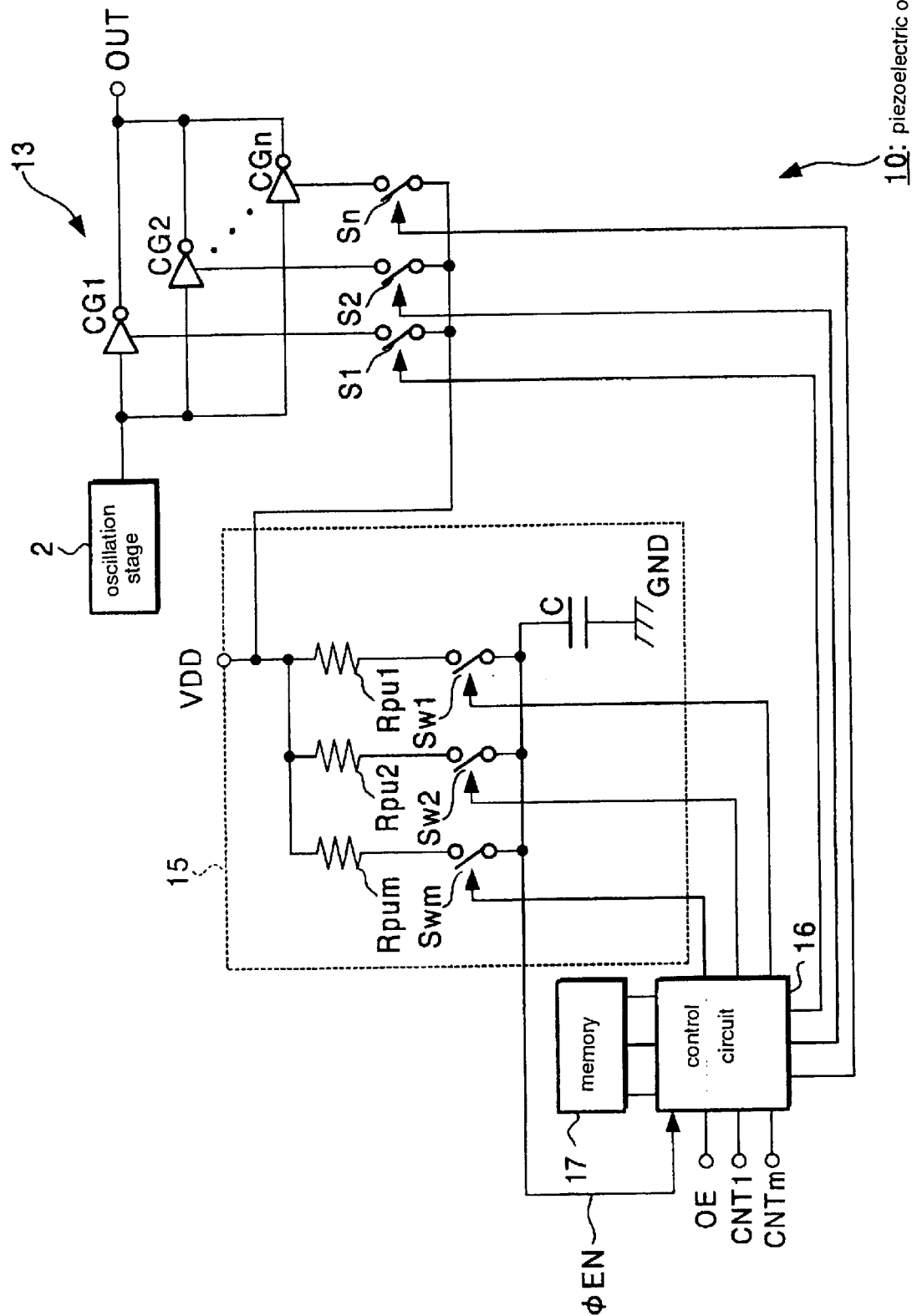
FIG. 6 is a block view of a piezoelectric oscillator relating to a second exemplary modified embodiment.

In this case, for instance, as shown in FIG. 6, the delaying circuit 15 may be a circuit, which is made up of one capacitor C, m pull-up resistors Rpuj (wherein j is 1, 2, . . . , m) connected in rows, and m switches Swj (wherein j is 1, 2, . . . , m) so as to control the connection/non-connection of each pull-up resistor Rpuj.

Figure 7:
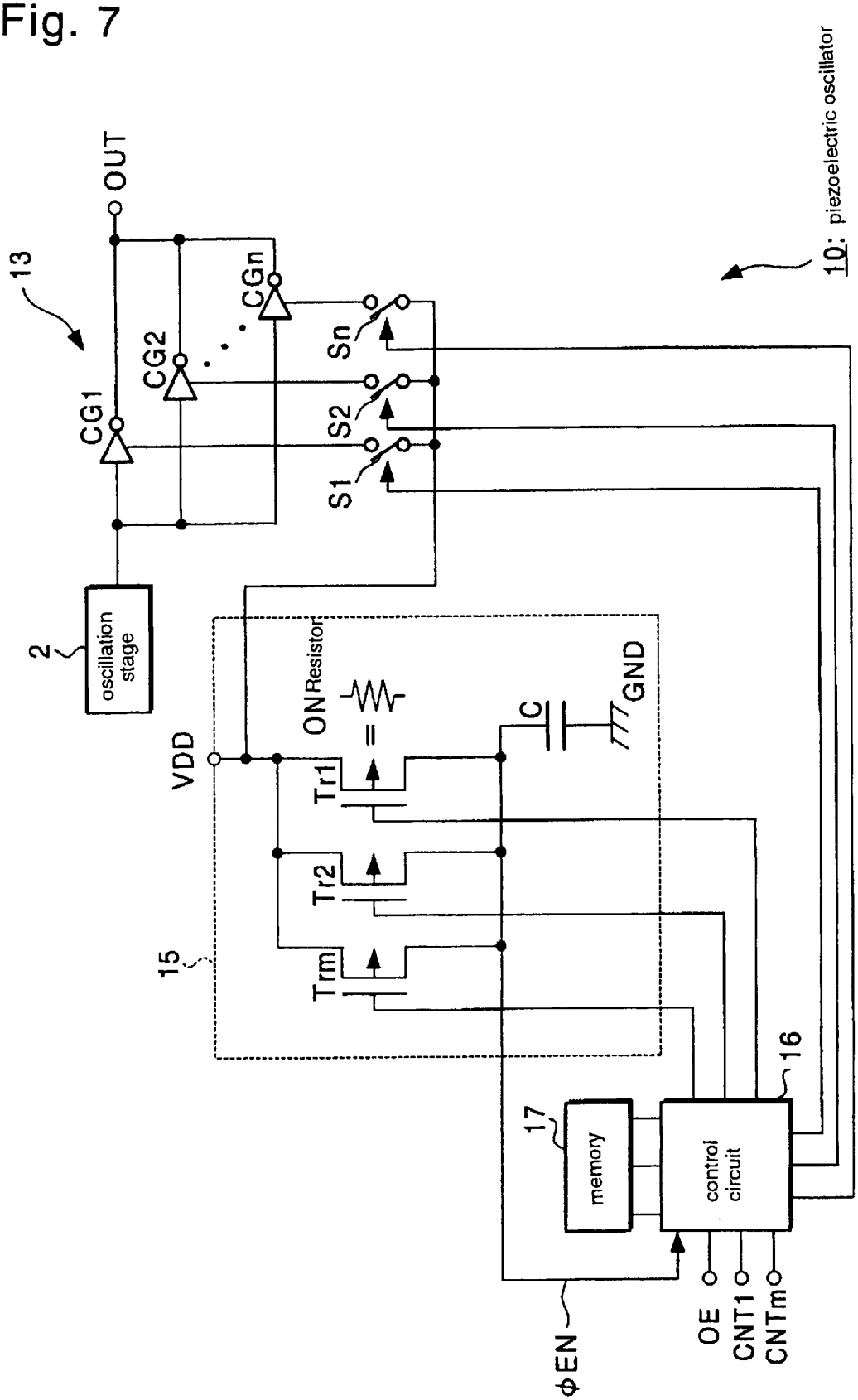
FIG. 7 is a block view of a piezoelectric oscillator relating to the second exemplary modified embodiment.

Furthermore, in this case, as shown in FIG. 7, the switches Swj may be replaced by the PMOS transistors Trj (wherein j is 1, 2, . . . , m), and the ON resistance of these PMOS transistors T j may be applied as pull-up resistance Rpuj. Subsequently, the number of elements of the delaying circuit 15 may be reduced, and a circuit configuration may be simplified.

(2-3) Third Exemplary Modified Embodiment

Figure 8:
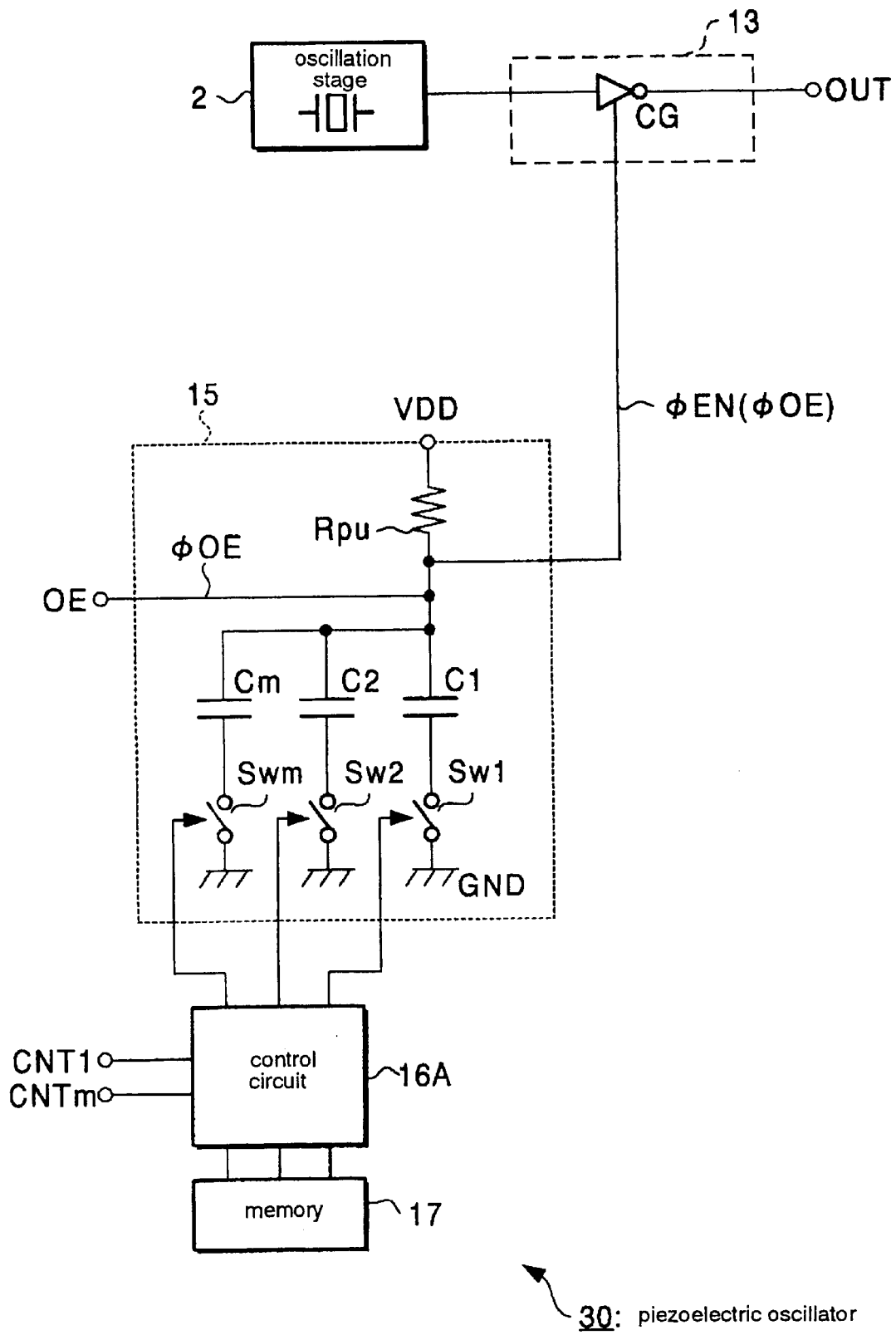
FIG. 8 is a block view of a piezoelectric oscillator relating to a third exemplary modified embodiment.

In the above-noted exemplary embodiment, the control circuit 16 starts the output stage 13, but the present invention is not limited to this case. For instance, as shown in FIG. 8 and FIG. 9, starting signals ØEN may be supplied to the input CNT of each clocked gate of the output stage 13 so as to directly start the output stage 13 by the starting signals ØEN.

Figure 9:
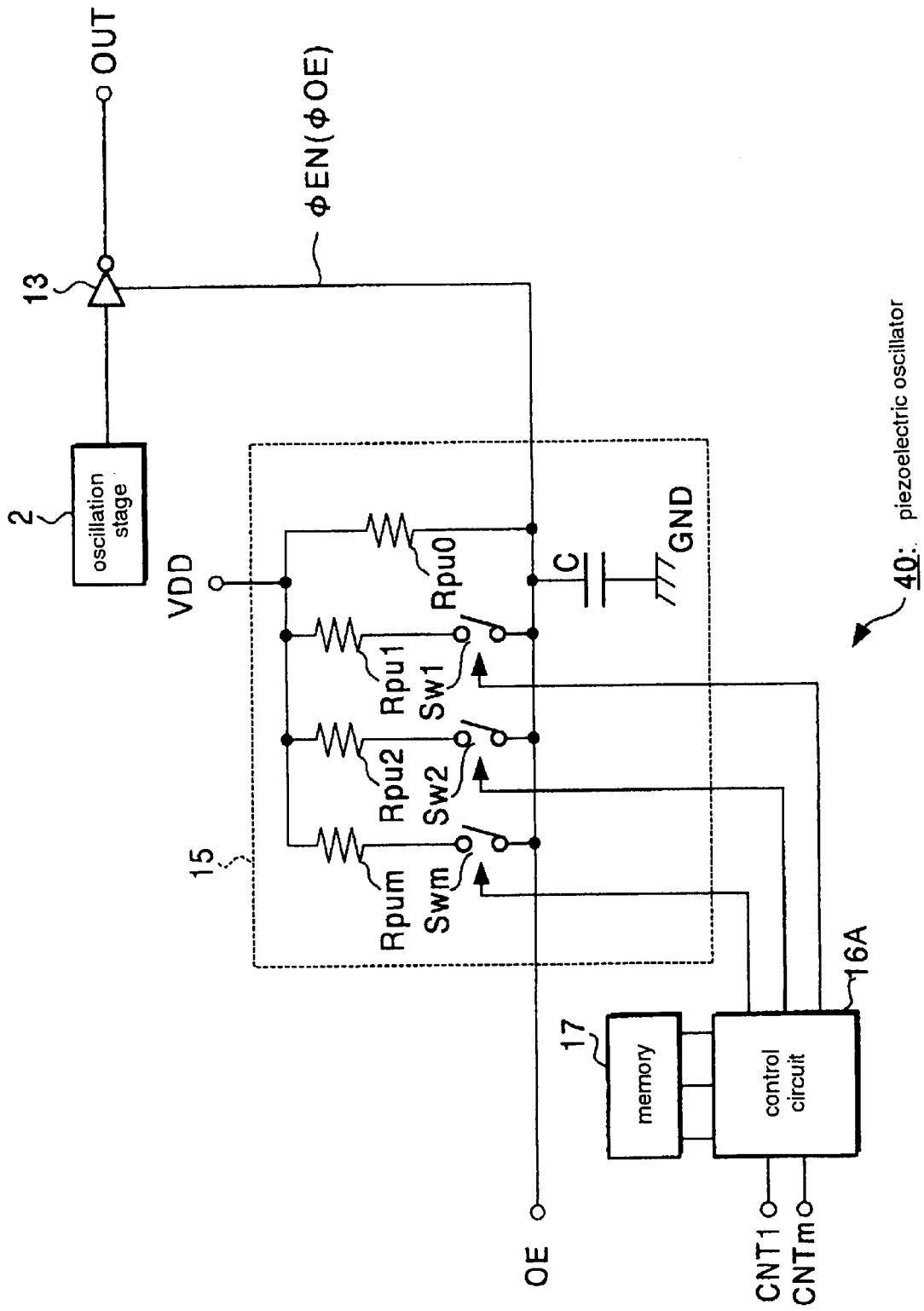
FIG. 9 is a block view of a piezoelectric oscillator relating to the third exemplary modified embodiment.

FIG. 9 is a circuit view of the piezoelectric oscillator 40 for controlling directly the output stage 13 by the starting signals ØEN and the output stop signals ØOE, wherein the delaying circuit 15 consists of one capacitor C, m pull-up resistors Rpuj, and m switches Swj as described in the second exemplary modified embodiment.

Moreover, when the output stage 13 is directly started by the starting signals ØEN, the control circuit should maintain the switches, to be connected to input CNT of the clocked gates in the number corresponding to necessary driving power for the output stage 13, in the ON state before the output stage 13 is started.

Thus, for instance, a configuration can be considered wherein the switches of the delaying circuit 15 and the switches to be connected to the input CNT of the clocked gates of the output stage 13 correspond to each other, and a switch, to be connected to the input CNT of the corresponding clocked gate, will be turned ON when the switch of the delaying circuit 15 is turned ON.

Particularly, when the piezoelectric oscillator has a single driving power for the output stage 13, as shown in FIG. 8 and FIG. 9, in other words, when a piezoelectric oscillator drives a single or a plurality of clocked gates constituting the output stage 13, start signals ØEN and output stop signals ØOE may be directly supplied to the clocked gates.

In this case, the control circuit (selecting circuit) 16A is only to control the switches of the delaying circuit 15, and the configuration of the control circuit 16A may be simplified.

Additionally, when the output stage 13 is directly stopped from driving by the output stop signals ØOE at the piezoelectric oscillator 30 shown in FIG. 8, the response to output the stop signals ØOE is ensured. Thus, it is preferable to turn OFF all the switches of the delaying circuit 15 after oscillation of the piezoelectric oscillator 30 is completed.

Moreover, if the output stop signals ØOE are directly supplied to the output stage 13 through the input terminal OE for inputting output stop signals, the resistance for setting the terminal electric potential is necessary so as to avoid the terminal electric potential from being inaccurate when the input terminal OE is in the open state. Therefore, the pull-up resistor Rpu is used as the resistor for setting the terminal electric potential in FIG. 8.

In FIG. 9, by arranging the pull-up resistor Rpu0, which is always connected to the input terminal OE for inputting output stop signals, terminal voltage is prevented from being inaccurate when switches Swj (wherein j is 1, 2, . . . , m) are all turned OFF.

Also, as the combined resistance of pull-up resistors Rpuj, to be connected to switches Swj at ON state, is small with the piezoelectric oscillator 40 shown in FIG. 9, the pull-up capability, in other words, the stability of terminal voltage, improves. However, when low-level signals are applied to the input terminal OE for inputting output stop signals as digital signals, a current path is formed from the power source VDD to ground GND through these pull-up resistors, which is not preferable at the standpoint of energy efficiency.

Therefore, even from the standpoint of energy efficiency, it is preferable to cut off the pull-up resistors Rpu1 to Rpum by turning OFF all the switches Swj of the delaying circuit after oscillation of the piezoelectric oscillator 40 is completed.

(2-4) Fourth Exemplary Modified Embodiment

In the embodiment mentioned above, a plurality of capacitors or pull-up resistors in which connection/non-connection is controlled by switches, are connected in rows by the delaying circuit 15. However, the present invention is not limited to this case, and a plurality of capacitors or pull-up resistors in which connection/non-connection is controlled by switches, may be connected in series, instead.

Figure 10:
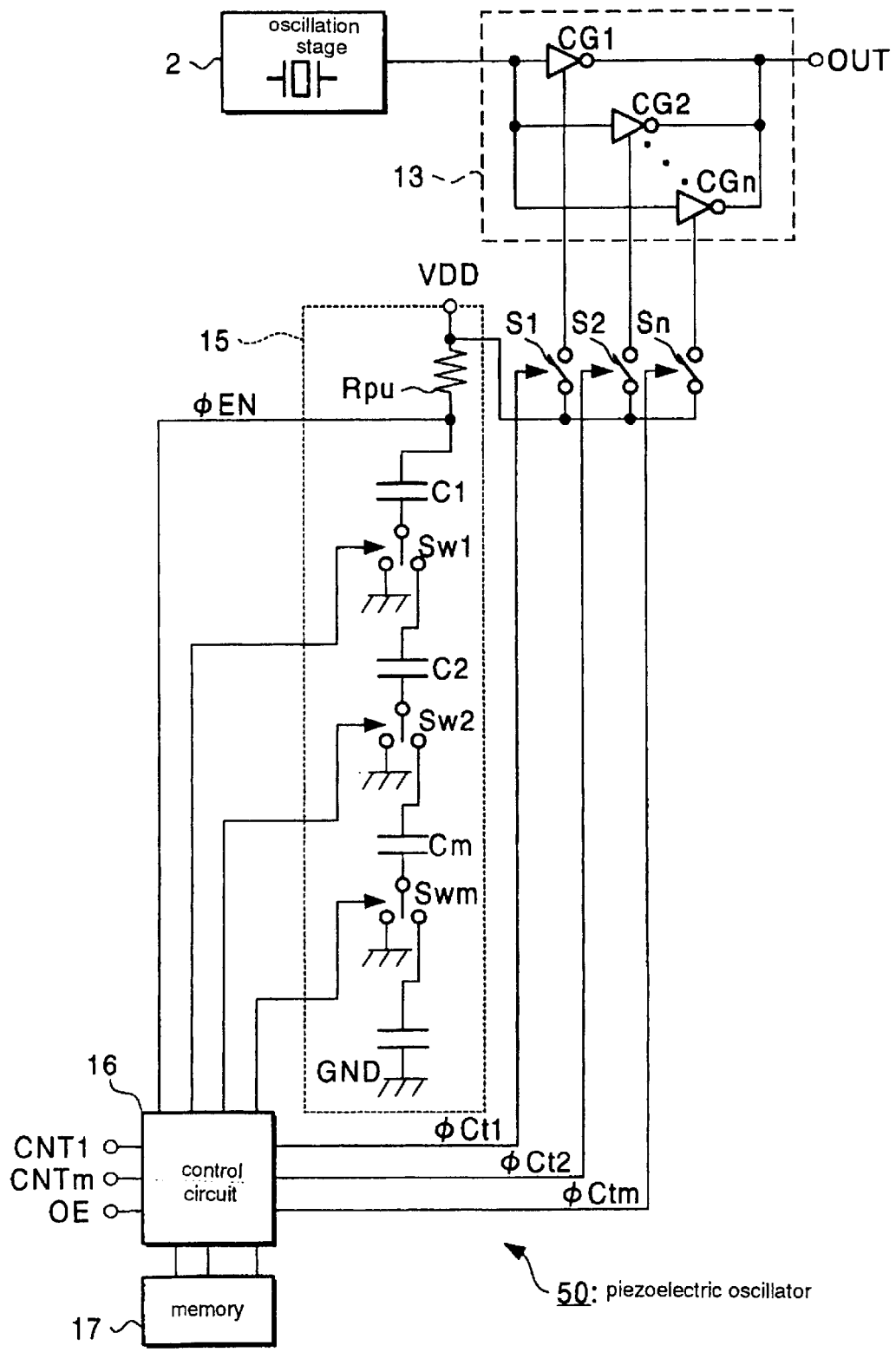
FIG. 10 is a block view of a piezoelectric oscillator relating to a fourth exemplary modified embodiment.

FIG. 10 is a block view of a piezoelectric oscillator 50 when the delaying circuit 15 is configured by connecting capacitors Cj (wherein j is 1, 2, . . . , m) in series wherein the connection/non-connection is controlled by switches Swj (wherein j is 1, 2, . . . , m). In this case, when the delay time of the start signals ØEN is set to be long, the number of capacitors to be connected in series is reduced.

(2-5) Fifth Exemplary Modified Embodiment

Figure 11:
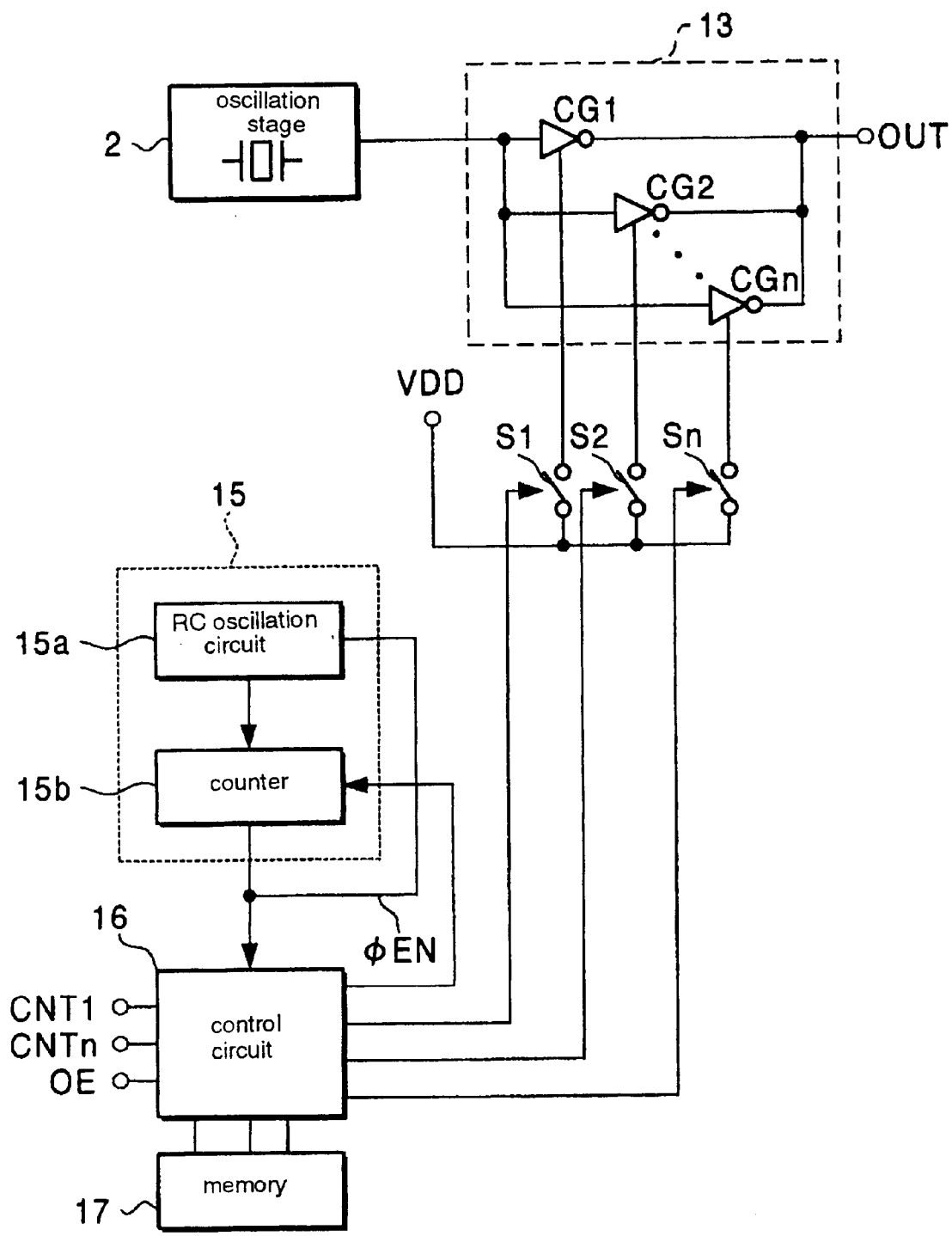
FIG. 11 is a block view of a piezoelectric oscillator relating to a fifth exemplary modified embodiment.

In the above-described embodiment, the delay time of the start signals ØEN is set preferably by using the delaying circuit 15, whose time constants vary depending on the connection state of a plurality of switches. However, the present invention is not limited to this case; and the delaying circuit 15 may be made up of the RC oscillation circuit 15a and the counter 15b as shown in FIG. 11.

In other words, the RC oscillation circuit 15a generates oscillation pulses at the delaying circuit 15 as power is input to the piezoelectric oscillator 60, and the counter 15b counts these oscillation pulses. When the count of the counter 15b reaches the pre-set value, high-level start signals ØEN are output. Additionally, start signals ØEN have the function to stop the RC oscillation circuit 15a from operating.

Thus, by changing the set value of the counter 15b with the control circuit 16, the start delay time of the output stage 13 may be changed as desired.

In this case, moreover, the RC oscillation circuit 15a may be used instead at the oscillation stage 2 so as to count the oscillation pulses P of the oscillation stage 2 with the counter 15b. Additionally, when the RC oscillation circuit 15a is used instead by the oscillation stage 2, the counting function of the counter 15b is stopped after start signals ØEN are output.

(2-6) Sixth Exemplary Modified Embodiment

The above-noted exemplary embodiment did not describe the mounting conditions of the components of a piezoelectric oscillator. However, the piezoelectric oscillator can surely oscillate pulses while lowering the power noise during the power supply process, so that elements, constituting the piezoelectric oscillator, can be integrated. For example, a piezoelectric oscillator where a circuit, excepting a resonator, is integrated (an integrated circuit), may be in a one package with a ceramic package or a plastic package.

Therefore, a piezoelectric oscillator may be miniaturized and the number of parts can be reduced, thus reducing the assembly man-hours and manufacturing costs.

(2-7) Seventh Exemplary Modified Embodiment

The above-mentioned exemplary embodiment did not refer to a device applying the piezoelectric oscillator relating to the present invention. However, this piezoelectric oscillator can be broadly applied as a piezoelectric oscillator, which may be built into a radio communication device and an electronic device.

Particularly, a piezoelectric oscillator, which is built in a portable radio communication device, carries out intermittent oscillation during intermittent reception so as to save batteries, so that abnormal oscillation or non-oscillation is usually a problem. Therefore, it is preferable to use the piezoelectric oscillator relating to the present invention for a portable radio communication device.

As described above, the piezoelectric oscillator of the present invention can reduce power noise during the power supply process and stabilize start characteristics, and can also improve oscillation stability.

What is claimed is:

1. A piezoelectric oscillator, comprising:
    an oscillation stage that generates oscillation pulses by exciting a piezoelectric resonator;
    an output stage that amplifies and outputs the oscillation pulses; and
    a start delaying circuit having a plurality of delay times so as to start the output stage later than the oscillation stage by a delay time selected from the plurality of delay times.

2. The piezoelectric oscillator according to claim 1, the start delaying circuit comprising:
    a selection circuit that selects a predetermined delay time from the plurality of delay times based on pre-set information; and
    a delaying circuit that gradually raises start signals in response to the selected delay time, and then outputs the start signals; and
    a starting circuit that starts the output stage in response to a value of the start signals.

3. The piezoelectric oscillator according to claim 2, the output stage comprising a plurality of clocked gates connected in rows, and the starting circuit starting the output stage by operating predetermined clocked gates among a plurality of clocked gates based on set information, which was set in advance, in response to a value of the start signals.

4. The piezoelectric oscillator according to claim 2, the selection circuit comprising an input terminal for inputting set information, the pre-set information being renewed to new set information as the new set information is input through the input terminal.

5. The piezoelectric oscillator according to claim 2, the starting circuit comprising an input terminal for stopping output, the output stage stopping operation as output stop signals are input through the input terminal for stopping output after the output stage is started.

6. The piezoelectric oscillator according to claim 1, the start delaying circuit comprising:
    a selection circuit that selects a corresponding delay time from the plurality of delay times based on pre-set information; and
    a delaying circuit that gradually raises start signals in response to the selected delay time, and outputs the start signals, the output stage starting in response to a value of the start signals.

7. The piezoelectric oscillator according to claim 6, the delaying circuit comprising:
    a resistance element;

a plurality of capacitance elements; and a plurality of switching devices connected to the plurality of capacitance elements, respectively, the selection circuit setting time constants of the delaying circuit to, the selected corresponding delay time by controlling the plurality of switching devices based on set information.

8. The piezoelectric oscillator according to claim 6, the delaying circuit comprising:

a capacitance element;

a plurality of resistance elements; and a plurality of switching devices connected to the plurality of resistance elements, respectively, the selection circuit setting time constants of the delaying circuit to the selected corresponding delay time by controlling the plurality of switching devices based on set information.

9. The piezoelectric oscillator according to claim 8, the switching devices being transistors, and the resistance elements being ON resistance of the transistors.

10. The piezoelectric oscillator according to claim 1, the start delaying circuit comprising:

a selection circuit that selects a predetermined delay time from the plurality of delay times based on pre-set information;

a delaying circuit that outputs start signals after a passage of the selected delay time as the oscillation stage is started; and a starting circuit that starts the output stage in response to a value of the start signals.

11. The piezoelectric oscillator according to claim 10, the output stage comprising a plurality of clocked gates connected in rows, and the starting circuit starting the output stage by operating predetermined clocked gates among a plurality of clocked gates based on set information, which was set in advance, in response to a value of the start signals.

12. The piezoelectric oscillator according to claim 10, the selection circuit comprising an input terminal for inputting set information, the pre-set information being renewed to new set information as the new set information is input through the input terminal.

13. The piezoelectric oscillator according to claim 10, the starting circuit input terminal for stopping output, the output stage stopping operation as output stop signals are input through the input terminal for stopping output after the output stage is started.

14. The piezoelectric oscillator according to claim 1, the start delaying circuit comprising:

a selection circuit that selects a predetermined delay time among the plurality of delay times based on pre-set information; and a delaying circuit that outputs start signals after a passage of the selected delay time as the oscillation stage is started, the output stage starting in response to a value of the start signals.

15. The piezoelectric oscillator according to claim 14, the delaying circuit comprising:

an oscillation circuit that generates oscillation pulses for setting the delay time; and a counter that counts the oscillation pulses for setting the delay time and the switch signal levels of the start signals as a counted number reaches a pre-set value, the selection circuit setting the counter to a value corresponding to the selected delay time based on set information.

16. The piezoelectric oscillator according to claim 15, the oscillation circuit being the oscillation stage.

17. The piezoelectric oscillator according to claim 1, except for the piezoelectric resonator, the piezoelectric oscillator being an integrated circuit.

18. The piezoelectric oscillator according to claim 17, the piezoelectric oscillator being stored in one package.

19. An electronic device, having the piezoelectric oscillator according to claim 18, and operating based on the oscillation pulses output from the piezoelectric oscillator.

* * * * *